(12) United States Patent
Pickreign

(10) Patent No.: US 11,881,377 B2
(45) Date of Patent: *Jan. 23, 2024

(54) AUTOMATED MULTI-GRID HANDLING APPARATUS

(71) Applicant: Richard Joseph Pickreign, Harvard, MA (US)

(72) Inventor: Richard Joseph Pickreign, Harvard, MA (US)

(73) Assignee: Richard J. Pickreign, Harvard, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/939,530

(22) Filed: Sep. 7, 2022

(65) Prior Publication Data

US 2022/0415607 A1 Dec. 29, 2022

Related U.S. Application Data

(63) Continuation of application No. 17/374,008, filed on Jul. 13, 2021, now Pat. No. 11,450,507, which is a
(Continued)

(51) Int. Cl.
*H01J 37/20* (2006.01)
*H01L 21/68* (2006.01)
*H01L 21/683* (2006.01)

(52) U.S. Cl.
CPC .......... *H01J 37/20* (2013.01); *H01L 21/6838* (2013.01); *H01J 2237/184* (2013.01);
(Continued)

(58) Field of Classification Search
CPC ............ H01L 21/6838; H01J 2237/184; H01J 2237/2007; H01J 2237/204; H01J 2237/2602; H01J 37/20
(Continued)

(56) References Cited

U.S. PATENT DOCUMENTS 11,075,055 B2 *   7/2021   Pickreign ................. H01J 37/20
11,450,507 B2 *   9/2022   Pickreign ............ H01L 21/6838

* cited by examiner

*Primary Examiner* — Nicole M Ippolito
(74) *Attorney, Agent, or Firm* — Richard J. Pickreign

(57) ABSTRACT

An automated grid handling apparatus for an electron microscope including a transport module having a multistage shuttle, the multistage shuttle having a first shuttle stage having a single degree of freedom of motion for gross movement, a second shuttle stage having a single degree of freedom of motion independent of the first stage for fine movement, an end effector connected to at least one of the first and second shuttle stages, the end effector being configured to hold a grid carrier and transport the grid carrier holding the grid into and out of an electron microscope through a transport interface that is communicably connected to a multi-axis positioning stage port of the electron microscope, the end effector having a range of motion, defined by a combination of the first and second stage degrees of freedom of motions and the multi-axis positioning stage internal to the electron microscope, and an automated loading module connected to the frame and being communicably connected to the transport module, the automated loading module including a load port module through which grids are loaded into the automated loading and transport modules.

20 Claims, 13 Drawing Sheets

Related U.S. Application Data continuation of application No. 16/611,935, filed as application No. PCT/US2018/032287 on May 11, 2018, now Pat. No. 11,075,055.

(60) Provisional application No. 62/504,835, filed on May 11, 2017.

(52) U.S. Cl.
CPC . *H01J 2237/204* (2013.01); *H01J 2237/2007* (2013.01); *H01J 2237/2602* (2013.01)

(58) Field of Classification Search
USPC ................ 250/440.11, 441.11, 442.11, 443.1
See application file for complete search history.

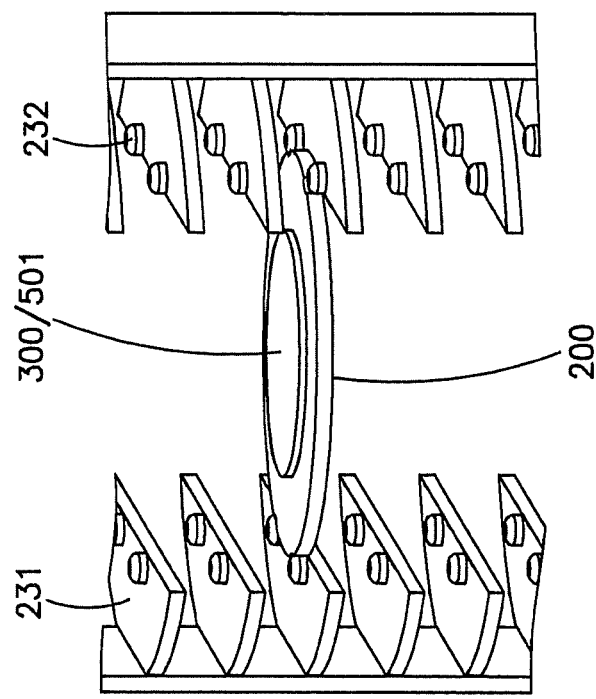
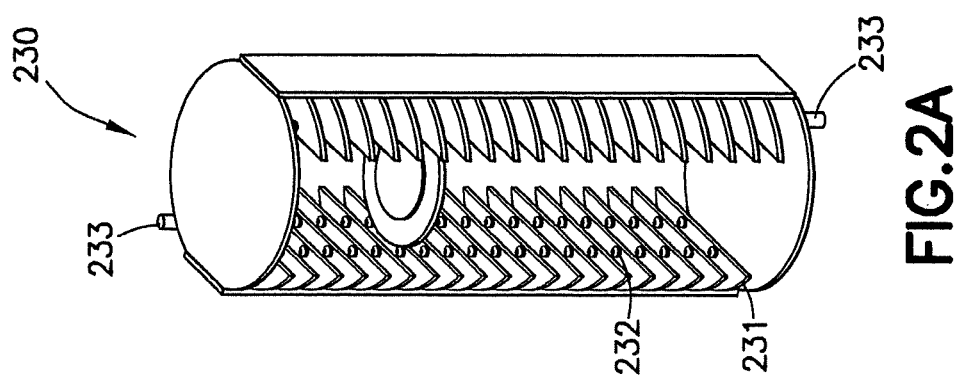

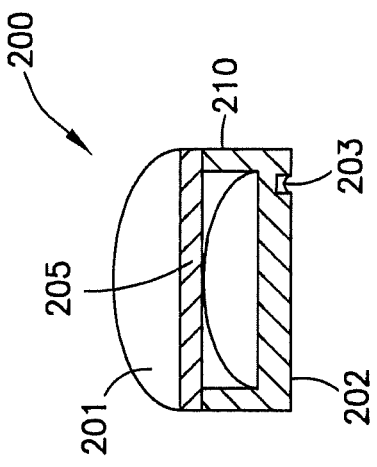
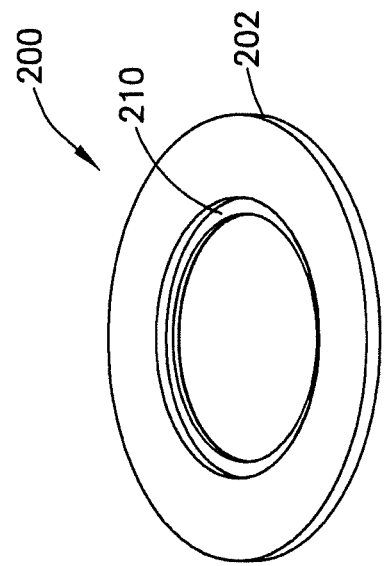
FIG.2C-D
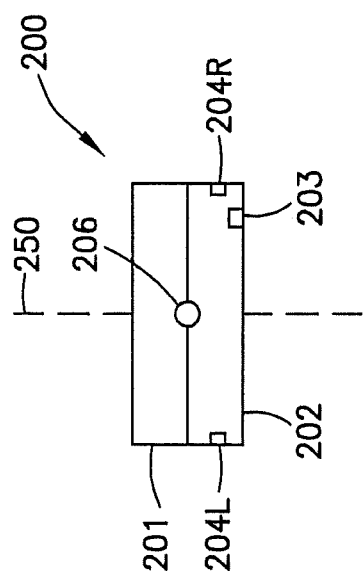
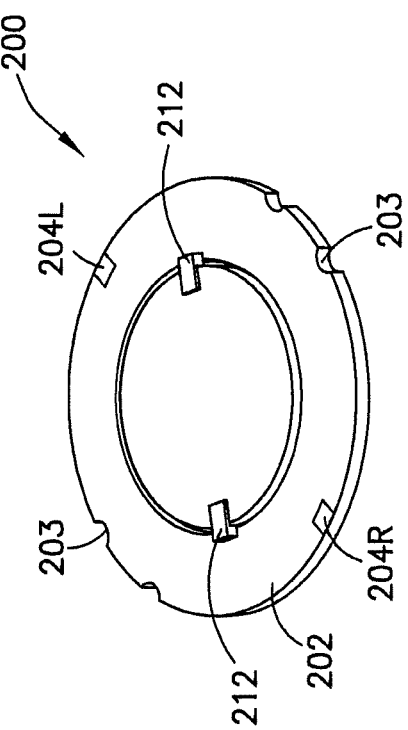
FIG.2E-F

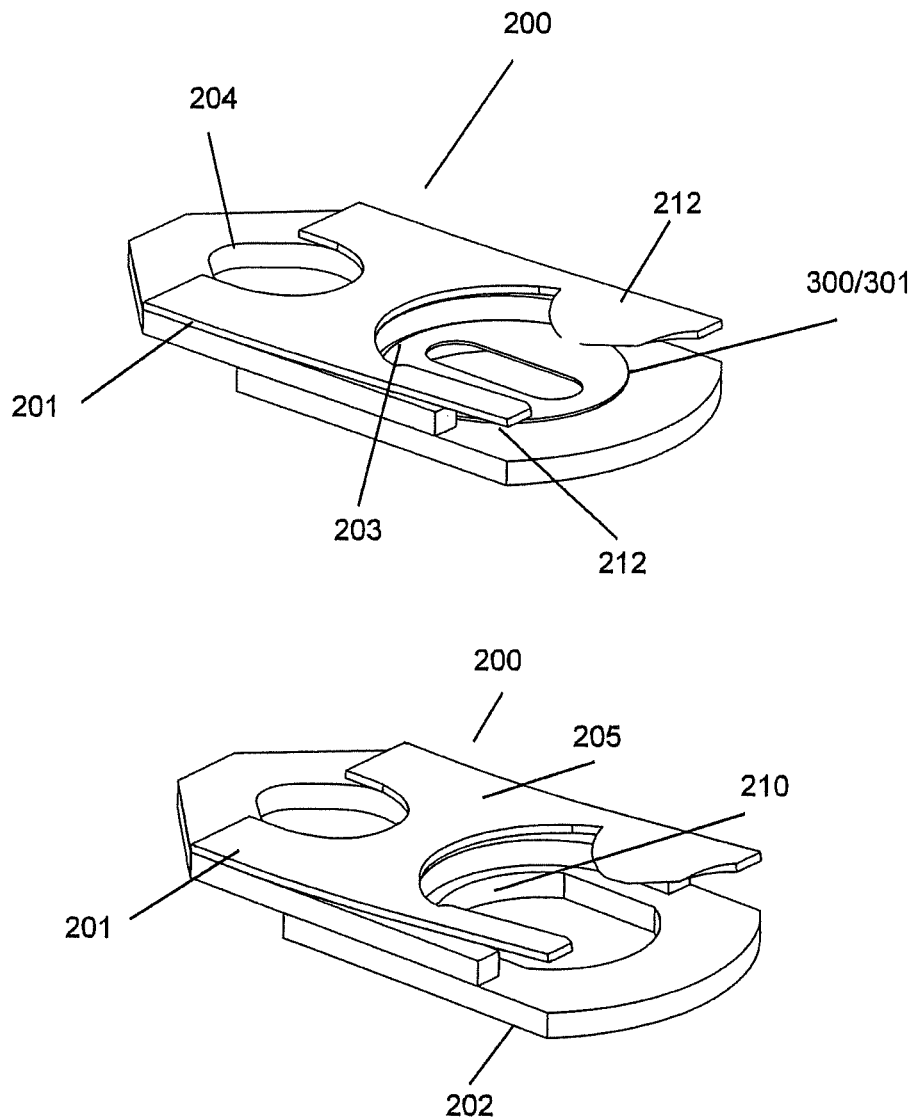
FIG. 2G-H

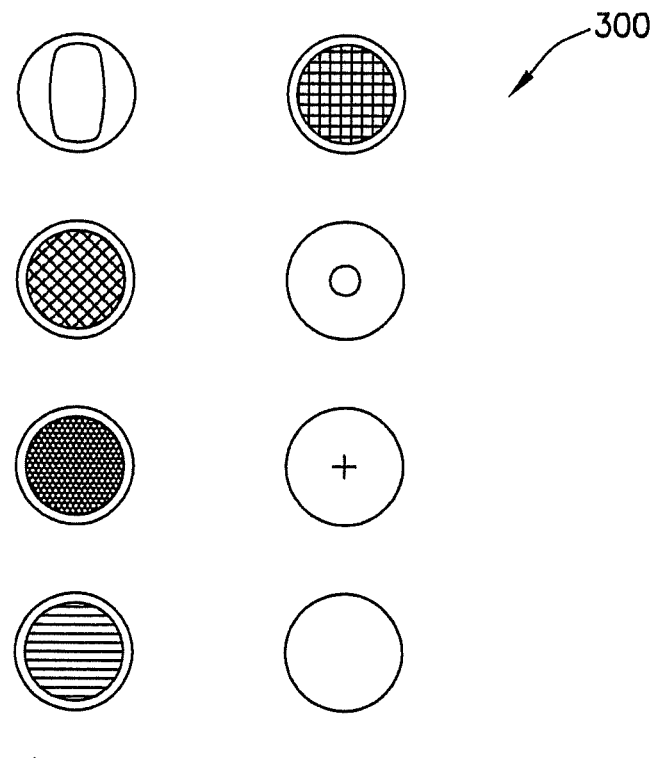
FIG.3A
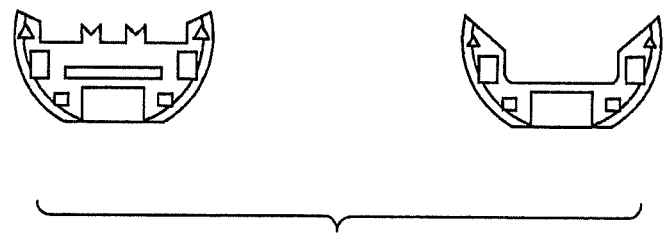
FIG.3B

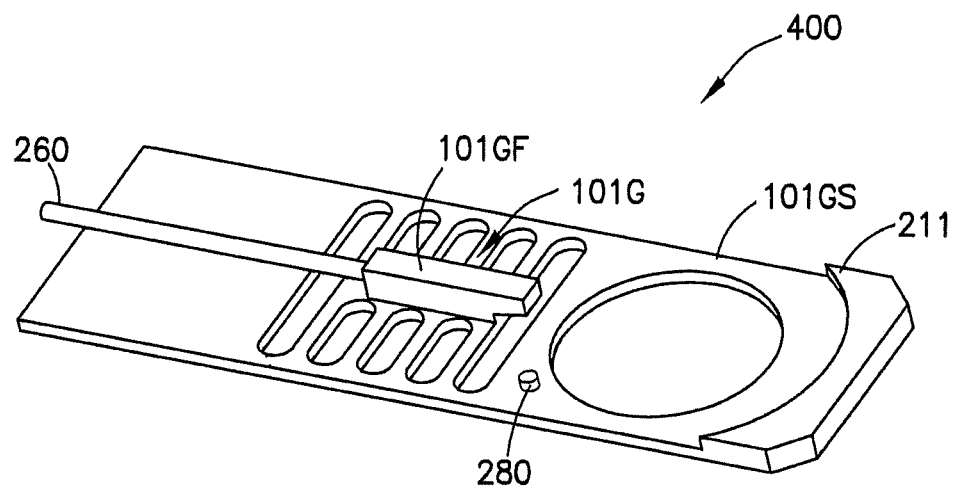
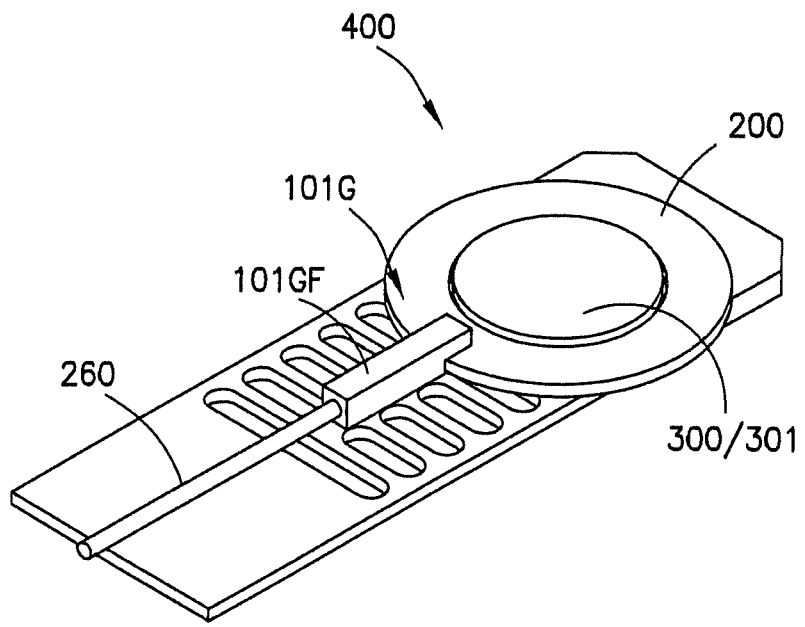
FIG.4B-C

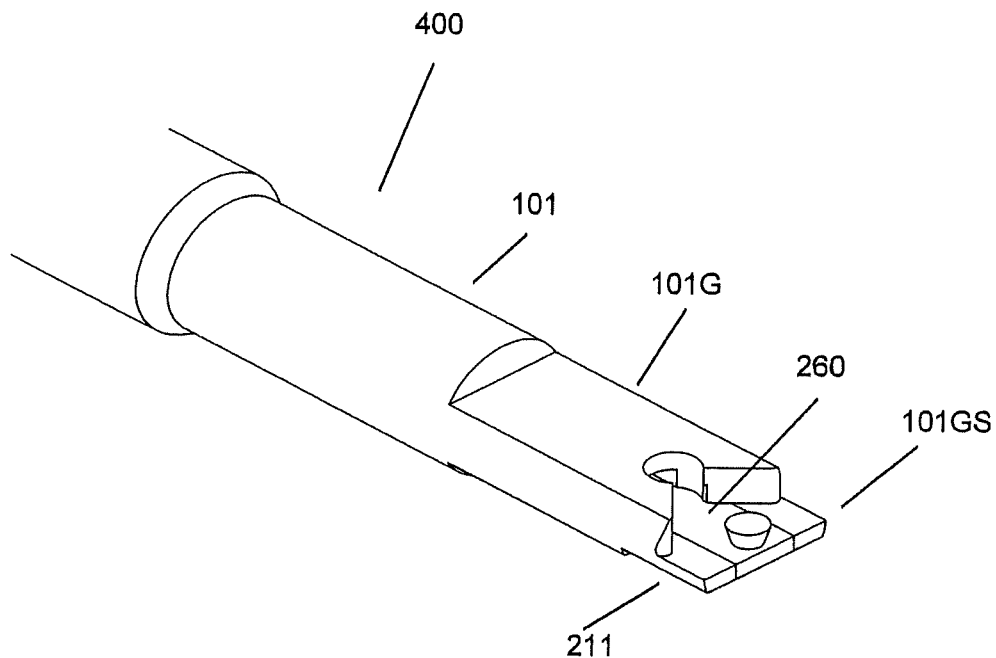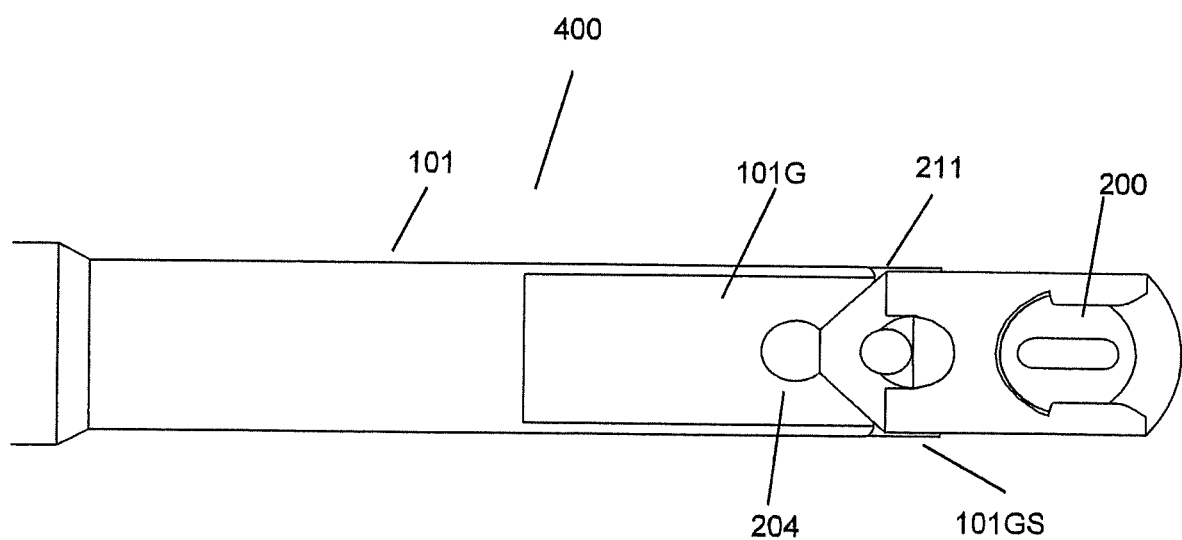
FIG. 4D-E

AUTOMATED MULTI-GRID HANDLING APPARATUS

CROSS-REFERENCE TO RELATED APPLICATIONS

This application is a continuation of U.S. application Ser. No. 17/374,008, filed Jul. 13, 2021, now U.S. Pat. No. 11,450,507, which is a continuation of U.S. application Ser. No. 16/611,935, filed on Nov. 8, 2019, now U.S. Pat. No. 11,075,055, which is a National Stage of International Application No. PCT/US2018/032287, having an International Filing Date of 11 May 2018, which claims priority to and benefit of U.S. Provisional Patent Application No. 62/504,835, filed May 11, 2017, the disclosures of which are incorporated herein by reference in their entireties.

BACKGROUND

1. Field

The exemplary embodiments generally relate to automated grid handling systems and, more particularly, to automatic grid handling systems for automated inspection or imaging systems.

2. Brief Description of Related Developments

Generally grids are loaded into an electron microscope, such as a transmission electron microscope (TEM), for inspection or imaging one at a time. The process to load a single grid is tedious and very time consuming. An operator prepares a specimen on a grid and carefully places the grid into a grid holder device. The operator then prepares the TEM to accept the grid holder device by venting the TEM's multi-axis positioning port. Next the operator inserts the grid holder device into the TEM's multi-axis positioning port and starts a pumping process. The pumping process will continue until the TEM's multi-axis positioning port reaches a vacuum level substantially similar the vacuum level in the TEM column. Once the vacuum level is achieved, the operator positions the grid holder to an operating position. The operator may then perform manual imaging tasks or run an automated task on a single grid. When the imaging tasks are complete, the operator vents the TEM's multi-axis positioning port and removes the grid holder. The final step is to remove the grid from the grid holder and load a new grid if desired.

There have been recent attempts to automate the handling of grids for a TEM. One such attempt provided a grid loader and position system that attached to a TEM's auxiliary port. Imaging was accomplished by positioning an end effector, directly clamping a grid, through the auxiliary port and into the path of the electron beam. All positioning was controlled by the grid loader and positioning system and the entire control system was external to the TEM. Only the end effector, directly clamping the grid, entered the TEM column 275 through the auxiliary port. The grid loader and positioning system is a standalone system that requires its own facilities such as pneumatics, electrical and vacuum sources. This approach is overly complex, costly and does not take advantage of facilities and systems internal to the TEM.

It would be advantageous to have an automatic grid handling system that handles a batch of grids and takes advantage of the facilities and systems internal to the electron microscope.

BRIEF DESCRIPTION OF THE DRAWINGS

The foregoing aspects and other features of the disclosed embodiment are explained in the following description, taken in connection with the accompanying drawings, wherein:

FIG. 2A is a perspective view of a grid carrier magazine in accordance with aspects of the disclosed embodiment;

FIG. 2B is a perspective view of a grid carrier magazine supporting a grid carrier on a shelf in accordance with aspects of the disclosed embodiment;

FIGS. 2C-D are schematic illustrations of a grid carrier in accordance with aspects of the disclosed embodiment, in a locked and unlocked position;

FIGS. 2E-F are perspective views of a grid carrier in accordance with aspects of the disclosed embodiment, holding a grid in a locked position;

FIGS. 2G-H are perspective views of a grid carrier in accordance with aspects of the disclosed embodiment, holding a grid in a locked position and empty in a unlocked position;

FIGS. 3A-3B are schematic illustrations of a grid in accordance with aspects of the disclosed embodiment;

FIGS. 4B-C are perspective views of a gripper end effector in accordance with aspects of the disclosed embodiment, clamp (close) and unclamp (open) a grid carrier;

FIGS. 4D-E are perspective views of a gripper end effector in accordance with aspects of the disclosed embodiment, clamp (close) and unclamp (open) a grid carrier;

DETAILED DESCRIPTION

Figure 1A:
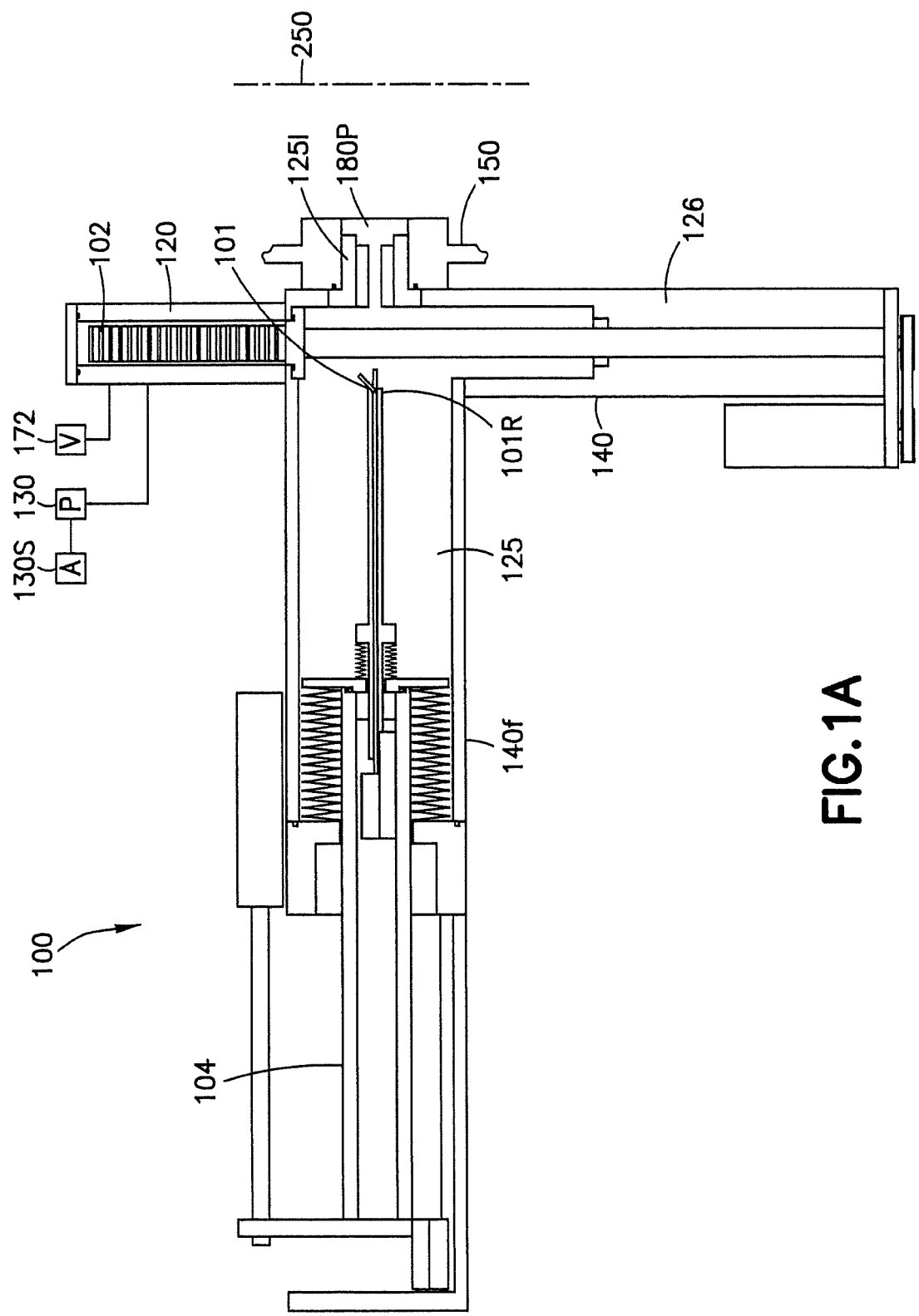
FIG. 1A is a schematic illustration of an automatic grid handling system in accordance with aspects of the disclosed embodiment, retracted.
Figure 1B:
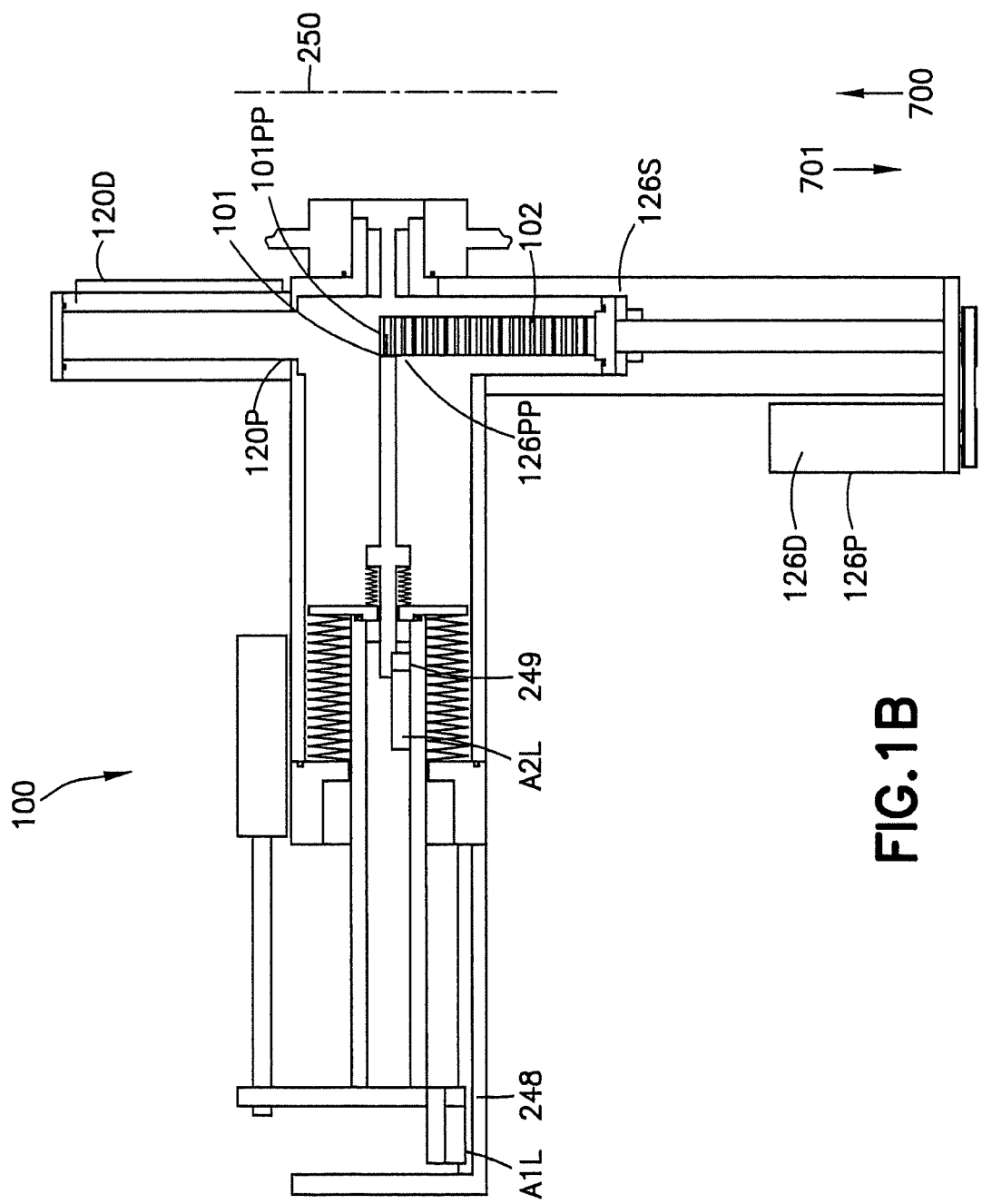
FIG. 1B is a schematic illustration of an automatic grid handling system in accordance with aspects of the disclosed embodiment, pick position.
Figure 1C:
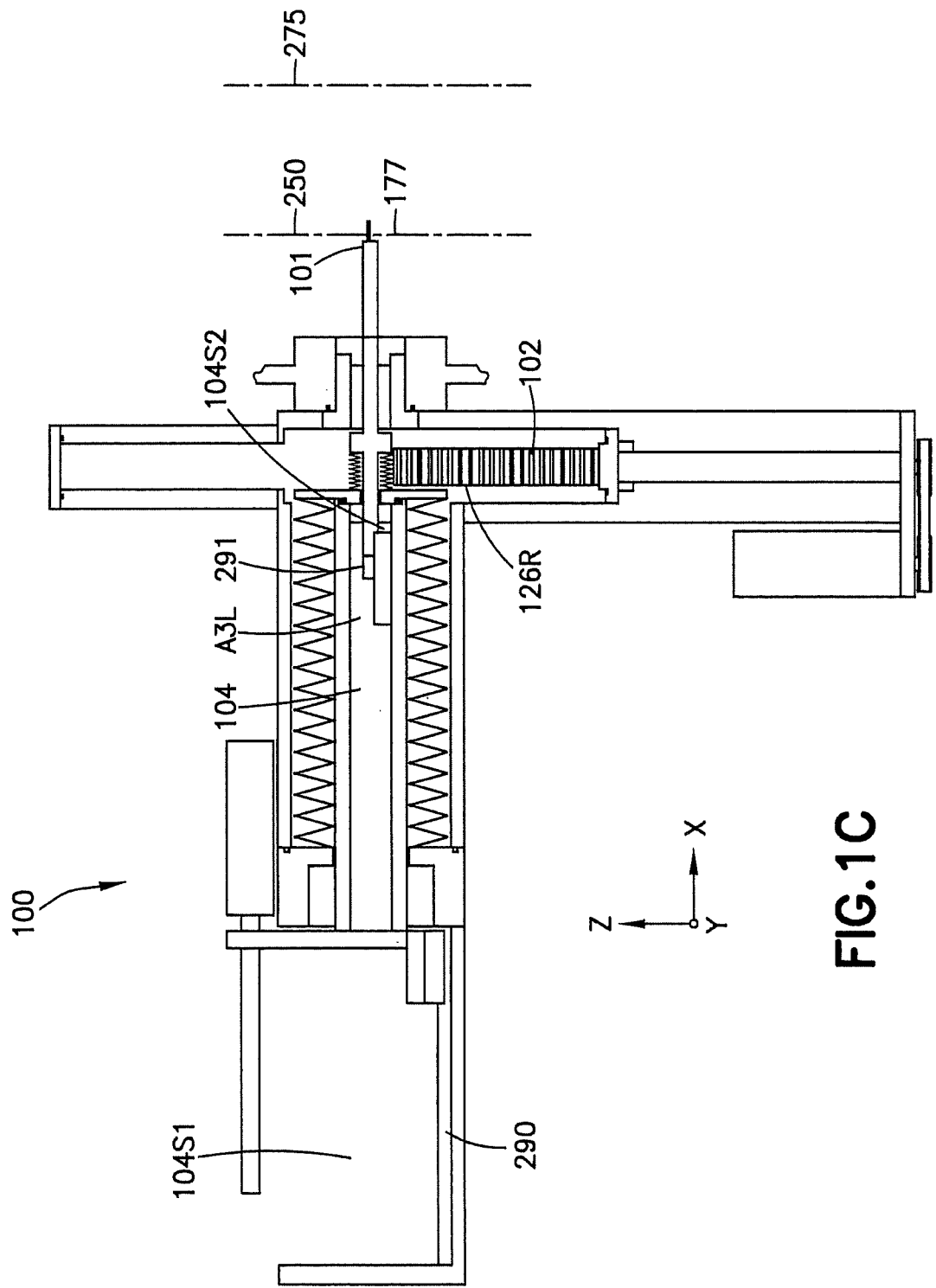
FIG. 1C is a schematic illustration of an automatic grid handling system in accordance with aspects of the disclosed embodiment, inspection position.

FIGS. 1A-1E are schematic illustrations and perspective views of an automatic grid handling system 100 in accordance with aspects of the disclosed embodiment. Although the aspects of the disclosed embodiment will be described with reference to the drawings, it should be understood that the aspects of the disclosed embodiment can be embodied in many forms. In addition, any suitable size, shape or type of elements or materials could be used. It is also noted that while X, Y and Z axis are referred to, reference to these axes is exemplary only and in other aspects the axes may have any suitable directional identifiers.

It should also be understood that while the aspects of the disclosed embodiments are described herein with respect to a transmission electron microscope (TEM), the aspects of the disclosed embodiment can be applied to any suitable grid (containing a specimen) inspection or imaging equipment where a grid is supported on a grid carrier during inspection or imaging of the grid (containing a specimen). For example, aspects of the disclosed embodiment may be employed in any suitable equipment where a grid is held in grid carrier by the end effector of the disclosed embodiment during inspection or imaging. In alternative embodiments, the end effector of the grid handling system may hold the grid directly during inspection or imaging.

In one aspect, in the context of the TEM, the automatic grid handling system 100 may provide loading and storage of about 25 grids (containing a specimen) in a single exchange (e.g. loading of a batch of grids containing specimens) while in other aspects related to the TEM or other suitable inspection equipment (such as those mentioned above) more or less grids (containing a specimen) may be loaded and stored. The automatic grid handling system 100 may be connected to a conventional multi-axis positioning stage 150 used in, for example, TEMs that provides substantially all necessary degrees of freedom of motion to position a grid within the TEM during inspection. A suitable example of a multi-axis positioning stage 150 of a TEM is the CompuStage™ manufactured by FEI. Alternatively, other suitable multi-axis positioning stages 150 are manufactured by JEOl and Hitachi High-Technologies. In other aspects the automatic grid handling system 100 may connect to any suitable loading system of, for example, any suitable imaging or inspection equipment. The automatic grid handling system 100 in combination with a conventional multi-axis positioning stage may provide, high-resolution, high-speed and high-stability position control of the grid during imaging or inspection. As will be described below, in accordance with the aspects of the disclosed embodiment, the grid handling and storage operations as well as the positioning of the grid (containing a specimen) in the TEM column 275 may be effected with, for example, the combination of the conventional multi-axis TEM positioning stage 150 and the automatic grid handling system 100.

As will also be described below, the automatic grid handling system 100 may include a transport module 125 that has an end effector 101 configured to substantially directly handle any suitable grid carrier 200, where the grid carrier 200 may support several different grid types 300/301, such as several different specimen grids 300/301. A gripper 400 as part of the end effector 101 may be operated through coordinated movement of two or more axis of motion, which when combined act to open and close the gripper 400, gripping the grid carrier 200. In other aspects the gripper 400 of the end effector may be operated in any suitable manner such as with a dedicated drive that drives the gripper to an open and closed position. In yet another aspect, the gripper 400 of the end effector 101 may be operated with a spring loaded flexure and a dedicated drive where the drive may drive the gripper to an open position and the spring may drive the gripper to a closed position. The end effector 101 may be configured to manipulate the grid carrier 200 that is holding the grid in a high vacuum environment or any other suitable environment such as a non-vacuum or low vacuum environment. The end effector 101 may be configured to grip individual grid carriers 200 during extraction from any suitable grid carrier magazine 102/230 having grid carrier shelves 231. The end effector 101 (and the grid positioning unit 104 which the end effector is a part of) may be configured to provide a precise and rigid interface to support the grid carrier holding a grid (containing a specimen) which enables fast position moves (e.g. about 8 to about 24 microns or any other suitable distance) and rapid settling (e.g. to about less than 5 nanometers) in less than about 100 ms substantially without introducing undesired vibrational modes in the grid during inspection or imaging. In other aspects the end effector 101 (and the grid positioning unit 104 which the end effector is a part of) may be configured to perform fast position moves (e.g. about 8 to about 24 microns or any other suitable distance) and rapid settling (e.g. to about less than 4 nanometers) in less than about 25 ms to about 35 ms substantially without introducing undesired vibrational modes in the grid during inspection or imaging. In other aspects the end effector 101 (and the grid positioning unit 104 which the end effector is a part of) may be configured to perform gross position moves and may drive the end effector to a hard stop 105 substantially without introducing undesired vibrational modes in the grid during inspection or imaging.

In one aspect the grids 300/301 may be held in the grid carrier 200. The grid carrier may support several different grid types 300/301 where the several different grid types may support several different specimen types (e.g., specimens resulting from life sciences, material sciences, semiconductor and any other suitable operations). The grid carrier may have pocket 210 that supports and constrains the several different grid types 300/301. In one aspect, there may be a different pocket 210 for each of the several different grid types 300/301 or in other aspects, there may be a single pocket 210 that supports and constrains more than one of the several different grid types 300/301. The grid carrier 200 may have a top section 201 and a bottom section 202 where the top section closes onto the bottom section. The top section and the bottom section may be connected by hinge 205. Hinge 205 may connect the top section to the bottom section and enable the top section to close onto the bottom section. In other aspects, any suitable connection mechanism may be used to connect the top section 201 and the bottom section 202. The grid carrier has a locking device 206 the locks the top section to the bottom section while the grid carrier is closed. The locking device 206 may be unlocked enabling the grid carrier to be opened. One of the several different grid types 300/301 may be loaded into the grid carrier when open and the grid may be constrained and supported while the grid carrier is closed and locked. The top section 201 and the bottom section 202 are configured such that the specimen on the grid may be exposed to the TEM beam 250 during imaging or inspection. The grid carrier may have gripping areas 204L and 204R where the gripper 400 as part of the end effector 101 may grip or constrain the grid carrier for transport of the grid carrier. The gripping areas 204L and 204R may be located at any suitable location on the grid carrier 200. In another aspect, the grid carrier 200 may have a single gripping area 204 and in still other aspects the grid carrier may have any number of suitable gripping areas that may be located at any suitable location on the grid carrier 200. The grid carrier 200 may have an alignment feature 203 that may align with the alignment feature 232 of the grid carrier shelf 231 of the grid carrier magazine 102/230. The alignment feature 203 may be located at any location on the grid carrier 200 and the alignment feature 232 may be located at any suitable location on the grid carrier shelf 231 of the grid carrier magazine 102/230. The grid may be loaded into the grid carrier in a certain orientation, aligning alignment feature 203 with alignment feature 232, required during imaging or inspection. In other aspects, the grid carrier 200 may have a bottom section 202, a pocket 210 that supports and constrains the several different grid types 300/301 and hold down fingers 212 that constrain the grid into the pocket 210.

In one aspect the grid carriers may be held in the grid carrier magazine 102/230 and are configured for insertion into the automatic grid handling system 100 as will be described below. The grid carrier magazine 102/230 and the grid carriers 200 therein may be configured to provide for the automatic or manual loading, inspection and removal of the grids supported in the grid carrier magazine 102/230. For example, the grid carrier magazine 102/230 may include kinematic features 233 that enable substantially direct handling of the grid carrier magazine 102/230 by a magazine handling system internal to the automatic grid handling system 100 and external to the automatic grid handling system 100. Kinematic feature 233 may be located at any suitable location on the grid carrier magazine 102/230. In one aspect the grid carrier magazine 102/230 supporting the grid carriers 200 may be configured for use in vacuum environments while in other aspects the grid carrier magazine 102/230 supporting the grid carriers 200 may be configured for use in non-vacuum environments. In another aspect the grid carrier magazine 102/230 may be loaded and unloaded of grid carriers external to the grid handling system 100 by a human or any other suitable loading equipment.

Still referring to FIGS. 1A-1E the automatic grid handling system 100 includes a frame 140F, transport module 125 connected to the frame 140F, loading module 140 connected to the frame 140F, a grid carrier magazine load lock 120, a pneumatics module 130 (which may be connected to the frame) and communicably coupled to the loading module 140 and the transport module 125, a vacuum module 172 (which may be connected to the frame) and communicably coupled to the loading module 140 and the transport module 125 and any other suitable computer control system having suitable processors and memories and any other facilities such a power distribution system. The pneumatics module 130 may include an air source 130S and any suitable valves for operating, e.g., valves and closures of the loading module 140 and/or vacuum module 172 described herein. The vacuum module 172 may include any suitable vacuum pumps for pumping and maintaining the internal chambers of the loading module 140 and the transport module 125 at any suitable vacuum pressure for interfacing with, for example, the TEM. The vacuum module 172 may also include any suitable valves for selectively isolating, e.g., the vacuum pumps from each other and/or from the chambers of the loading module 140. In one aspect, the vacuum module 172 may include any suitable vacuum pumps for pumping and maintaining the grid carrier magazine load lock 120 at any suitable vacuum pressure for interfacing with, for example, the TEM. In one aspect, the vacuum pressure of the internal chambers of loading module 140 and transport module 125 may be maintained and control by the vacuum pumps included with the TEM while the vacuum pressure of the carrier magazine load lock 120 may be maintained and controlled by the vacuum module 172.

In one aspect the frame 140F may form or be integral (e.g. of one piece unitary construction) to at least part of the loading module 140. In other aspects the loading module 140 may be connected to the frame 140F in any suitable manner. In one aspect the loading module 140 may include a sealable grid carrier magazine load lock chamber 120. The grid carrier magazine load lock chamber 120 may be selectively communicably connected to the transport module 125 through a closable opening or port 120P. The loading module 140 may include any suitable isolation device configured to selectively seal the port 120P for sealing or otherwise isolating an atmosphere of the grid carrier magazine load lock chamber 120 from an atmosphere of the transport module 125 and the TEM column 275. The grid carrier magazine load lock chamber 120 may include any suitable door 120D configured to seal a load/unload opening of the grid carrier magazine load lock chamber 120. In one aspect the door may be hinged to the grid carrier magazine load lock chamber 120 while in other aspects the door 120D may be removable from the grid carrier magazine load lock chamber 120 for allowing access to the grid carrier magazine load lock chamber 120. In one aspect the door 120D may have a manual closure, and in other aspects the door 120D may have an automated closure. The loading opening may be configured to allow ingress and egress of a grid carrier magazine 102/230 to and from the grid carrier magazine load lock chamber 120. In one aspect, as will be described further below, the grids may be TEM grids held by grid carriers 200 which in turn are held in a grid carrier magazine 102/230. In one aspect the grid carrier magazines 102/230 and the grid carrier magazine load lock chamber 120 may be configured for manual operator insertion and removal of the grid carrier magazine 102/230 to and from the grid carrier magazine load lock chamber 120 while in other aspects the grid carrier magazines 102/230 and the grid carrier magazine load lock chamber 120 may be configured for automated insertion and removal of the grid carrier magazine 102/230 to and from the grid carrier magazine load lock chamber 120. In one aspect the grid carrier magazine load lock chamber 120 may have a pressure indicator to alert when the door 120D may be opened. In another aspect the door may have a locking mechanism to lock and unlock the door 120D based on the pressure indicator. The door 120D may be locked when there is a pressure differential between the grid carrier magazine load lock chamber 120 pressures and the outside atmosphere. The door 120D may be unlocked when the grid carrier magazine load lock chamber 120 pressure is substantially the same as the outside atmosphere.

Figure 1D:
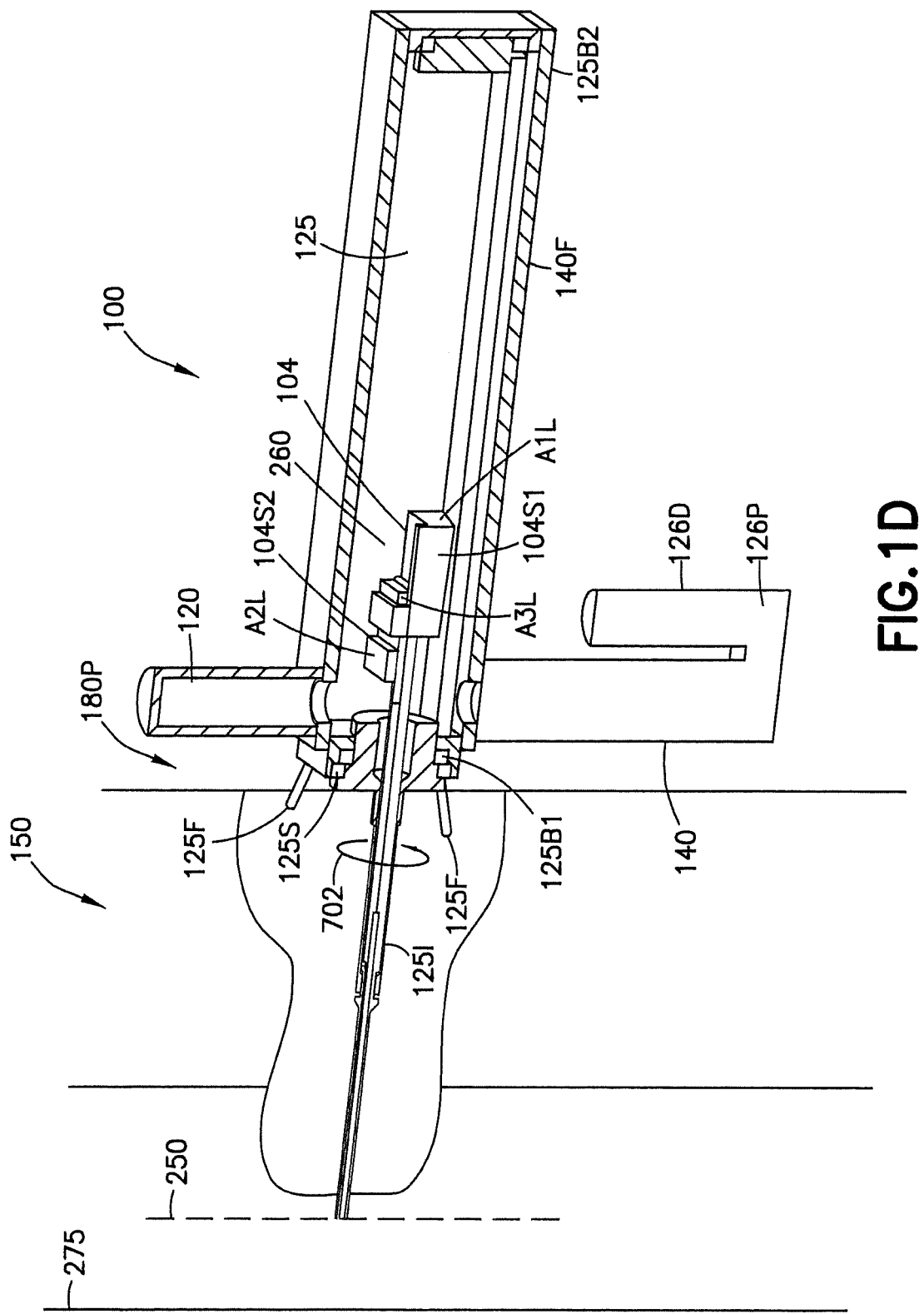
FIG. 1D is a perspective view of an automatic grid handling system in accordance with aspects of the disclosed embodiment, inspection position.
Figure 1E:
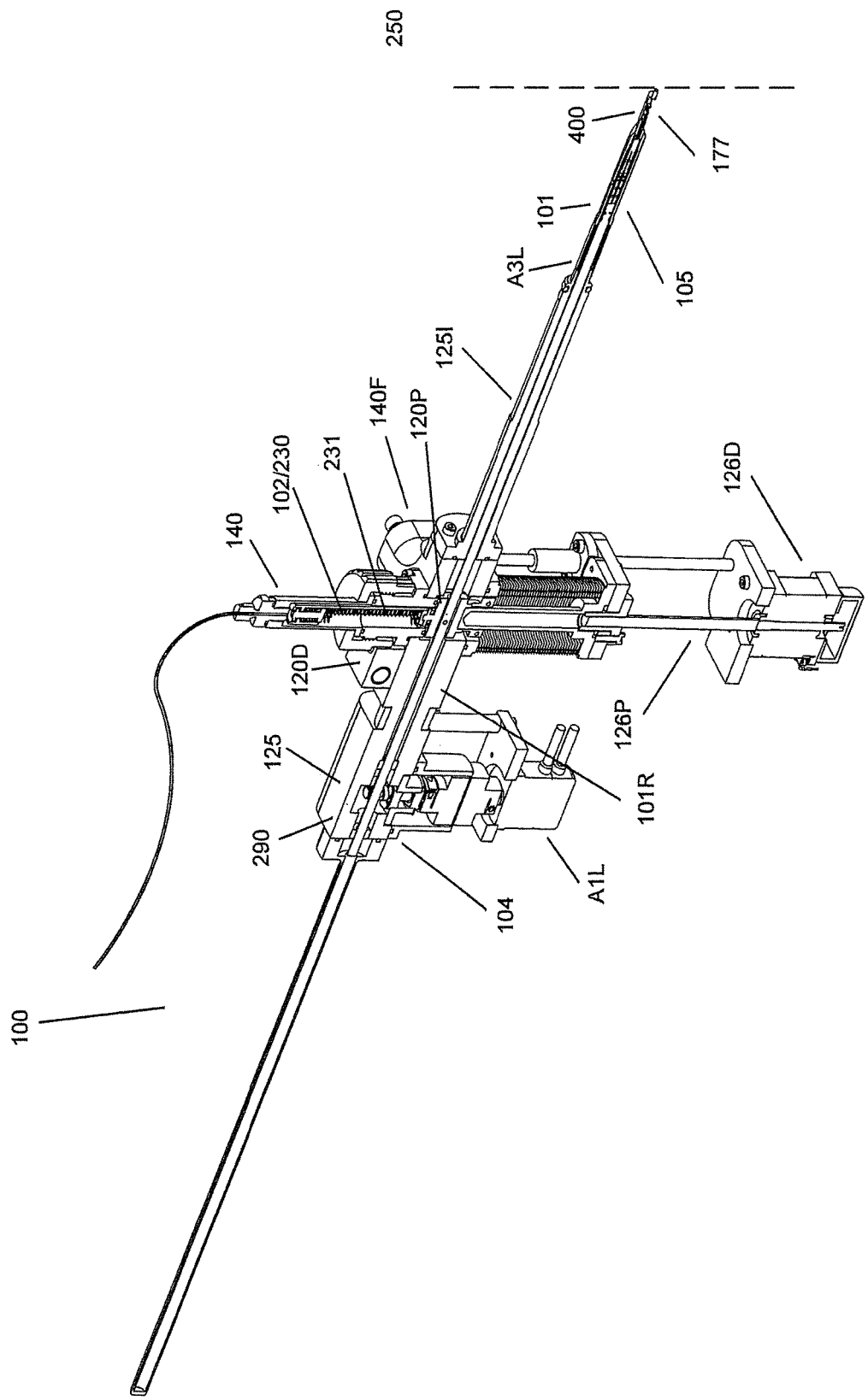
FIG. 1E is a perspective view of an automatic grid handling system in accordance with aspects of the disclosed embodiment, inspection position.
Figure 4A:
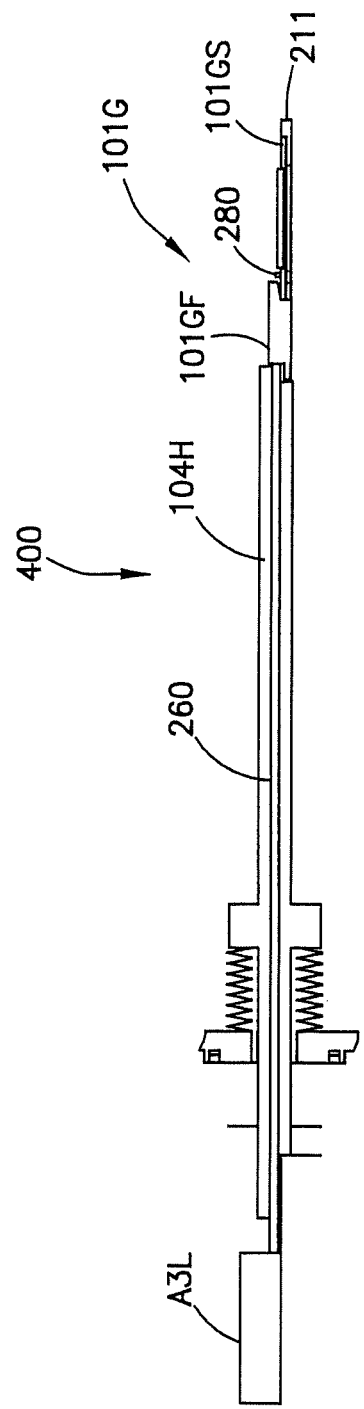
FIG. 4A is a schematic illustration of a gripper end effector in accordance with aspects of the disclosed embodiment.

The transport module 125 may include a transport module interface 125I configured to couple and uncouple the grid handling system 100 to and from a corresponding interface, such as interface or port 180P, of the TEM so that the grid handling system 100 can be installed to or removed from the TEM as a unit. The transport module interface 125I communicably connects the transport module 125 and the loading module 140 with an interior of the TEM through the port 180P. The transport module interface 125I may connect the grid handling system 100 to the conventional multi-axis positioning stage 150 used in, for example, TEMs that position grid carriers 200 or grids 300/301 within the TEM during inspection. In one aspect, the grid handling system 100 may load a grid carrier 200 holding a grid and position the grid carrier in the X direction using high-resolution, high-speed and high-stability position control and the conventional multi-axis positioning stage 150 may position the grid carrier 200 in the Y, Z and theta directions using conventional means during imaging or inspection. In another aspect, a grid handling system 100 may load a grid carrier and the conventional multi-axis positioning stage 150 may position the grid carrier in the X, Y, Z and theta directions using conventional means during imaging or inspection. In one aspect the grid handling system 100 driven by the conventional multi-axis positioning stage 150 may move in the X, Y, Z and theta directions. In other aspects, the grid handling system 100 driven by the conventional multi-axis positioning stage 150 may move in the Y and Z directions only. Referring now to FIG. 1D, the grid handling system 100 may include transport module interface bearing 125B1, transport module interface seal 125S, transport module rear bearing 125B2 and grid handling system fastener 125F. In one aspect, the conventional multi-axis positioning stage 150 may move the grid carrier 200 in the direction of arrow 702 (theta or roll). The frame 140F may be fastened directly to the TEM using one or more grid handling system fasteners 125F prohibiting the frame from moving in the direction of arrow 702 (theta or roll). In one aspect, the one or more grid handling system fasteners 125F may allow the frame 140F to move in the X, Y and Z axes. The transport module 125 may include transport module interface bearing 125B1, transport module interface seal 125S and transport module rear bearing 125B2 allowing transport module 125, including transport interface 125I, end effector 101 and multistage 104 to move in the direction of arrow 702 (theta or roll). Referring again to FIG. 1D, the transport module 125 and the magazine shuttle chamber 126 may be at substantially the same pressure as the TEM column 275 and may be maintained and control by the vacuum pumps included with the TEM. In one aspect, the conventional multi-axis positioning stage 150 may move in the direction of arrow 702 (theta or roll) by +/−75 degrees. In one aspect, the grid handling system 100 may move in the direction of arrow 702 (theta or roll)+/−75 degrees, while in other aspects the frame 140F and the loading module 140 will remain fixed while portions of the transport module may move the direction of arrow 702 (theta or roll)+/−75 degrees. In one aspect, the seal may be a Ferrofluidic seal, in other aspects the seal may be any suitable seal configured to maintain a seal (isolation barrier between the transfer module and atmosphere) while portions of the transport module move in the direction of arrow 702 (theta or roll).

The loading module 140 may include a grid carrier magazine shuttle chamber 126 communicably connected to the transport module 125. The grid carrier magazine shuttle chamber 126 may include a grid carrier magazine shuttle 126S that may be driven along any suitable axis by a grid carrier magazine shuttle positioner 126P. The grid carrier magazine shuttle positioner 126P may include any suitable drives or motors 126D and/or guides for allowing movement of a grid carrier magazine shuttle along at least the Z axis. In one aspect the motor 126D may be any suitable motor having any suitable position resolution such as ultrasonic piezo motor, stepper motors, brushless motors, brushed motors, etc. The grid carrier magazine shuttle 126S may be a linear stage configured to move (via the grid shuttle positioner 126P) into a position (e.g. through the port 120P) for picking/removing and placing/inserting a grid carrier magazine 102/230 from and to the grid carrier magazine load lock 120. In one aspect, the grid carrier magazine 102/230 includes kinematic features 233 that enables manual and automated loading of the grid carrier magazine 102/230 into the grid carrier magazine shuttle load lock 120 through door 120D. The grid carrier magazine shuttle 126S may also be configured to move the grid carrier magazine 102/230, to a predetermined pick/place position 126PP or to a grid carrier magazine retract position 126R along at least the Z axis. With the grid carrier magazine 102/230 at the pick/place position 126PP, the end effector 101 of the grid positioning unit 104 may be allowed to remove and/or insert a grid carrier from and/or to the grid carrier magazine 102/230. The grid shuttle 126S may also be configured to move the grid carrier magazine 102/230 to a predetermined retract position (as will be described below) to allow the grid positioning unit 104 to move along the X axis for transporting the grid carrier to the TEM. In one aspect the positioning unit 104 moves the grid carrier through the transport module interface 125I and into the TEM column 275 for inspection or imaging.

Still referring to FIGS. 1A-1E, the transport module 125 may include the grid carrier positioning unit (multistage shuttle) 104 which may be configured to pick/place grid carriers from/to the grid carrier magazine 102/230, transport the grid carrier (holding the grid and specimen) through the transport module interface 125I to the TEM column 275 and support the grid carriers during inspection or imaging within the TEM column 275. The grid positioning unit 104 (multistage shuttle) may include a first shuttle stage 104S1 (gross positioning stage) having single degree of freedom of movement and configured to move the end effector 101 along the X axis. The grid positioning unit 104 may also include a second shuttle stage 104S2 (fine positioning stage) that is carried by the first stage but is separate and distinct from the first stage in its operation. The second shuttle stage 104S2 having a single degree of freedom of movement, independent of the first shuttle stage 104S1, and configured to move the end effector 101 along the X axis. The combined movements of the first and second shuttle stages 104S1, 104S2 may provide the end effector 101 with a range of motion extending from a grid positioning unit 104 retract position 101R outside the TEM to an inspection or imaging location 177 inside the TEM for positioning the grid carrier at the inspection or imaging location 177 so that the end effector 101 defines at least a portion of the inspection or imaging stage of the TEM. In another aspect, the grid positioning unit 104 may include a first shuttle stage (gross positioning stage) only; in other aspects any suitable number of stages may be used. The movement of the first shuttle stage 104S1 may provide the end effector 101 with a range of motion extending from a grid positioning unit 104 retract position 101R outside the TEM to an inspection or imaging location 177 inside the TEM for positioning the grid carrier at the inspection or imaging location 177 so that the end effector 101 defines at least a portion of the inspection or imaging stage of the TEM.

The first shuttle stage 104S1 and the second shuttle stage 104S2 may include X axis drive or motors A1L and A2L respectively. It is noted that the drives A1L and A2L (as well as the other drives described herein) may respectively include any suitable encoders 248 and 249 which may be, for example, optical encoders, laser interferometric encoders, capacitive or inductive encoders or any other suitable encoder or combinations thereof. In one aspect the encoders described herein may have a picometer position resolution while in other aspects the encoders may have any suitable position resolution that may be consistent with the positioning resolution of a respective drive motor of the axis along which the encoder is providing position data. In still other aspects the encoders described herein may have a positioning resolution that is larger or smaller than the position resolution of the respective drive motor. In other aspects the drives described herein may employ any suitable integral position sensing capabilities of the drives. It is noted that any suitable portions of the drives A1L and A2L may be sealed from an atmosphere of the transport module 125 and the loading module 140 for isolating components, such as motors, to allow operation of the stages in a vacuum environment. In one aspect, the sealing or isolation may be accomplished by using vacuum bellows 160 and 161 for the first shuttle stage 104S1 and the second shuttle stage 104S2 respectively. In other aspects drives A1L and A2L may be configured to operate in a vacuum environment in any suitable manner while in still other aspects the drives may be configured to operate in an atmospheric environment. The X axis drives A1L and A2L may include any suitable motor and a linear stage having any suitable mechanical and/or solid state electromagnetic (and/or permanent magnet) guides 290 and 291 for translating the end effector 101 along the X axis. In one aspect the motor may be an ultrasonic piezo motor with less than about 1 um positioning resolution while in other aspects the motor may be any suitable motor having any suitable positioning resolution such as a stepper motor, brushless motor, brushed motor, etc. The drives A1L and A2L may be configured to move the end effector towards and away from the grid carrier magazine 102/230 for picking and placing grid carriers from and to the grid carrier magazine 102/230 and transporting the grid carriers along the X axis any suitable desired distance. The drive A1L and A2L may also be configured to move the end effector 101 through the transport interface 125I and into the TEM for inspection or imaging of the grid held in the grid carrier by the end effector 101.

The Y, Z and theta (roll) axes motion may be monitored and controlled by the conventional mulita-axis positioning stage 150 in the TEM. In one aspect the conventional multi-axis positioning stage may include any number of additional axes of motion. The grid handling system 100, using the first shuttle stage 104S1 and the second stage 104S2 may provide motion (gross positioning 104S1) and (fine positioning 104S2) along the X axis only. All other axis of stage motion may be monitored and controlled by the conventional multi-axis positioning stage 150 in the TEM. In one aspect, the grid positioning unit 104 may only include a first shuttle stage 104S1, and the conventional multi-axis positioning stage 150 in the TEM may monitor and control the X, Y, Z and theta (roll) axes of the end effector 101 during imaging or inspection. In another aspect, the grid positioning unit 104 may include a first shuttle sage 104S1 and the second stage 104S2 may be fixed (no monitoring or position control), and the conventional multi-axis positioning stage 150 in the TEM may monitor and control the X, Y, Z and theta (roll) axes of the end effector 101 during imaging or inspection.

Referring to FIGS. 4A-4E, in one aspect, the end effector 101 may be coupled to the drive A3L in any suitable manner such as by a connecting or driven member 260 supported within the housing 104H in any suitable manner. In another aspect, the connecting or driven member 260 may be supported outside of the housing 104H in any suitable manner. In one aspect the connecting or driven member 260 may be connected to a gripper 101G having a gripper flexure 101GF and a gripper grid support surface 101GS. In one aspect the gripper grid support surface 101GS may include one or more alignment features 211 disposed adjacent the gripper grid support surface 101GS. The alignment features 211 may have any suitable shape for interfacing with, for example a side edge of the grid carrier 200 and to position the grid carrier (e.g. through substantial contact between the side edge of the grid carrier and the alignment features 211) relative to the grid support surface 101GS. In another aspect, the alignment features 211 may interface with the top section 201 or the bottom section 202 of the grid carrier 200 or any other suitable gripping surface of the grid carrier 200. In still another aspect, alignment features 211 may interface with only the bottom section 202 of the grid carrier 200 or any other suitable gripping surface of the grid carrier 200.

The drive A3L and the drive A1L may be configured for operation along the X axis to actuate the gripper 101G of the end effector 101 as will be described below. Movement of the drives A3L and A1L may cause relative movement between the end effector 101 and the housing 104H of the first shuttle stage 104S1 (e.g. while maintaining the end effector 101 at a predetermined position) so that the gripper flexure 101Gf and the gripper support surface 101GS opens and/or closes. In one aspect the gripper 101G opens enabling the gripper flexure 101GF and the gripper support surface 101GS to move in position adjacent to the gripping areas 204L and 204R and in another aspect where the gripper 101G closes enabling the gripper flexure 101GF and the gripper support surface 101GS to constrain the grid carrier 200 at the gripping areas 204L and 204R for transport and positioning of the grid carrier 200. In another aspect, the gripper 101G may be opened and closed by any suitable driving mechanism configured to constrain the grid carrier 200 at any suitable location during transport and positioning.

A grid carrier detecting sensor 280 may be mechanically mounted to the end effector 101 adjacent to the grid gripper 101G for detecting the grid carrier 200 before, after and/or during grid handling. In one aspect the grid detecting sensor 280 may include any suitable sensor capable of detecting the presence or absence of a grid carrier. In other aspects, end effector 101 may have no sensor 280. In still other aspects, the position of 101GF relative to 101GS may be capable of determining the presence or absence of a grid carrier 200. In other aspects, the grid detection sensor may be located at any suitable location within the grid handling system 100.

Figure 5:
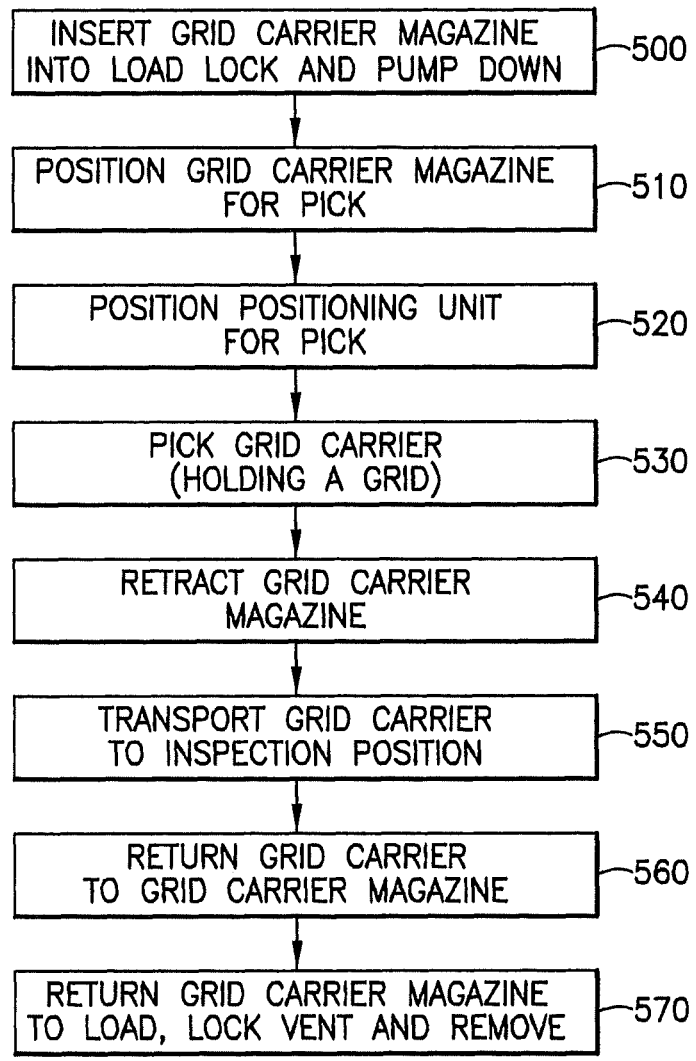
FIG. 5 is a flow diagram in accordance with aspects of the disclosed embodiment.

Referring now to FIGS. 1A-1E and 5 an exemplary operation of the automatic grid handling system 100 will be described in accordance with an aspect of the disclosed embodiment. The transport module 125 and the loading module 140 may be pumped by using the TEM vacuum system (or in another aspect, using the vacuum module 172) to a pressure substantially equal to a pressure of the TEM column 275. A grid carrier magazine 102/230 holding one or more grid carriers 200 may be inserted into the grid carrier magazine load lock chamber 120 (FIG. 5, Block 500). For example, the door 120D may be opened, the grid carrier magazine 102/230 may be kinematically placed on the grid carrier magazine shuttle 126S and the door 120D may be closed to seal or otherwise isolate the grid carrier magazine load lock chamber 120. The grid carrier magazine load lock chamber 120 may be pumped to a pressure compatible with or substantially equal to the pressure within the transport module 125, loading module 140 and the TEM column 275. The grid carrier magazine shuttle 126S may move in the direction of arrow 701 opening port 120P and moving the grid carrier magazine 102/230 such that a predetermined grid carrier is located at a pre-pick location and is within a range of motion of the grid positioning unit 104 (FIG. 5, Block 510). The grid positioning unit 104 may move in the X direction for positioning the end effector to a pick location 101PP (FIG. 5, Block 520), the grid carrier magazine shuttle may move in the direction of arrow 701 to a pick location 126PP, the end effector gripper 400 may constrain the grid carrier, and pick a grid carrier (holding a grid) from the grid carrier magazine 102/230 (FIG. 5, Block 530). The grid positioning unit 104 may retract to a retract position 101R and the grid carrier magazine shuttle 126S may move further in the direction of arrow 701 to move the grid carrier magazine to a retracted position 126R (FIG. 5, Block 540). The grid positioning unit 104 may move in the X direction for positioning the grid carrier (holding a grid) through the transport interface 125I and into the TEM column 275, and in combination with the conventional multi-axis positioning stage 150, for inspection or imaging while being held by the end effector 101 (FIG. 5, Block 550). The grid positioning unit 104 may retract from the TEM to the retract position 101R. The grid carrier magazine shuttle 126S may move in the direction of arrow 700 to the pre-place location, the grid positioning unit 104 may move to the place location 101PP, the grid carrier magazine shuttle 126S may move in the direction of arrow 701 to the place location 126PP, the gripper may release the grid holder placing the grid holder onto the grid carrier magazine 102/230, and the grid positioning unit 104 may retract to retract location 101R, the grid positioning unit 104 may return the grid carrier 200 to the position in the grid carrier magazine 102/230 from which the grid was taken (FIG. 5, Block 560). As may be realized, in one aspect additional grid carriers (holding a grid) held by the grid carrier magazine 102/230 may be exchanged before the grid carrier magazine 102/230 is returned to the load lock 120 for removal (FIG. 5, Block 570).

In accordance with one or more aspects of the disclosed embodiment an automated grid handling apparatus for an electron microscope is provided. The automated grid handling apparatus includes a frame configured to removably couple to a multi-axis positioning stage port of the electron microscope, a transport module connected to the frame, the transport module including a multistage shuttle, the multistage shuttle having a first shuttle stage having a single degree of freedom of motion, a second shuttle stage having a single degree of freedom of motion independent of the first stage and an end effector connected to at least one of the first and second shuttle stages, the end effector being configured to hold a grid carrier and transport the grid carrier holding the grid into and out of the electron microscope through a transport interface and the multi-axis positing stage port, the end effector having a range of motion, defined by a combination of the first and second stage degrees of freedom of motions and a multi-axis positioning stage internal to the electron microscope, extending from a grid holding location outside the electron microscope to an inspection location inside the electron microscope for positioning the grid carrier holding the grid at the inspection location so that the end effector partially defines an inspection stage of the electron microscope; and an automated loading module connected to the frame and being communicably connected to the transport module, the automated loading module including a load port module through which grids are loaded into the automated loading and transport modules.

In accordance with one or more aspects of the disclosed embodiment the single degree of freedom of movement of each of the first and second shuttle stage share a common direction.

In accordance with one or more aspects of the disclosed embodiment the single degree of freedom of movement of the first shuttle stage and the single degree of freedom of movement of the second shuttle stage are configured for a gross movement and a fine movement along the common direction.

In accordance with one or more aspects of the disclosed embodiment the automated grid handling apparatus includes a carrier magazine shuttle separate and distinct from the multistage shuttle, the carrier magazine shuttle being configured to transport grid carriers holding grids between a loading module of the automated grid handling apparatus and the multistage shuttle.

In accordance with one or more aspects of the disclosed embodiment the carrier magazine shuttle is configured to transport a grid carrier magazine configured to hold one or more grid carriers, where the grid carriers are configured to hold a grid.

In accordance with one or more aspects of the disclosed embodiment the multistage shuttle is configured for operation in a vacuum environment.

In accordance with one or more aspects of the disclosed embodiment portions of the multistage shuttle is configured for operation in an atmospheric environment.

In accordance with one or more aspects of the disclosed embodiment a motion resolution of the multistage shuttle is 0.5 micron.

In accordance with one or more aspects of the disclosed embodiment the end effector includes an integral sensor configured for determining the presence or absence of the grid.

In accordance with one or more aspects of the disclosed embodiment the grid comprises a specimen grid.

In accordance with one or more aspects of the disclosed embodiment the grid carrier is configured to support a plurality of grid types.

In accordance with one or more aspects of the disclosed embodiment the grid carrier is configured to support a plurality of grid types.

In accordance with one or more aspects of the disclosed embodiment the grid carrier is configured to align and constrain the grid in a predetermined orientation.

In accordance with one or more aspects of the disclosed embodiment the grid carrier magazine is configured to align and constrain the grid carrier on a grid carrier magazine shelf.

In accordance with one or more aspects of the disclosed embodiment the frame, the transport module and the loading module is configured to move in the Y, Z and theta axis direction when the transport module is driven by the multi-axis positioning stage.

In accordance with one or more aspects of the disclosed embodiment the frame, the transport module and the automated loading module is configured to move in X, Y, Z and theta axis direction when the transport module is driven by the multi-axis positioning stage.

In accordance with one or more aspects of the disclosed embodiment the end effector is configured to hold the grid directly and transport the grid into and out of the electron microscope through a transport interface.

In accordance with one or more aspects of the disclosed embodiment the grid carrier magazine is configured to hold one or more grids directly.

In accordance with one or more aspects of the disclosed embodiment an automated grid handling apparatus for an electron microscope is provided. The automated grid handling apparatus includes a frame configured to removably couple to a multi-axis positioning stage port of the electron microscope, a transport module connected to the frame, the transport module being configured to transfer grid carriers holding grids in combination with a multi-axis positioning stage internal to the electron microscope, the transport module having a rotary bearing and seal and being configured to move in a theta axis direction when driven by the multi-axis positioning stage, an end effector connected to the transport module, the end effector being configured to hold the grid carrier and transport the grid carrier into and out of the electron microscope through a transport interface communicably connected to the multi-axis positioning stage port, where the end effector partially defines an inspection or imaging stage of the electron microscope and an automated loading module connected to the frame and being communicably connected to the transport module, the automated loading module including a load port module through which grids are loaded into the automated loading and transport modules.

In accordance with one or more aspects of the disclosed embodiment a theta axis direction range is +/−75 degrees.

In accordance with one or more aspects of the disclosed embodiment the frame is fastened using a fastener to the electron microscope, wherein the frame and automated loading module being configured not to move in the theta axis direction when the transport module is driven by the multi-axis positioning stage.

In accordance with one or more aspects of the disclosed embodiment the fastener is configured to prevent movement of the frame and the automated loading module in the theta axis direction and allow movement of the frame, transport module and automated loading module in the X, Y, and Z axis direction when the transport module is driven by the multi-axis positioning stage.

In accordance with one or more aspects of the disclosed embodiment the transport module includes a multistage shuttle, the multistage shuttle having a first shuttle stage having a single degree of freedom of motion, a second shuttle stage having a single degree of freedom of motion independent of the first stage where the single degree of freedom of movement of the first shuttle stage and the single degree of freedom of movement of the second shuttle stage are configured for a gross movement and a fine movement respectively along a common direction.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of the appended claims. Further, the mere fact that different features are recited in mutually different dependent or independent claims does not indicate that a combination of these features cannot be advantageously used, such a combination remaining within the scope of the aspects of the invention.

What is claimed is:

1. A specimen holder apparatus for an imaging system, the specimen holder apparatus comprising:
   an end effector with an alignment feature for releasably receiving a grid carrier with a specimen thereon;
   at least one flexure that is connectable to the end effector for fixing the grid carrier in the alignment feature of the end effector, wherein the flexure is movably connected to the end effector, wherein the flexure is movable between a clamped and an unclamped position, wherein in the unclamped position the grid carrier can be placed adjacent to the alignment feature of the end effector, and wherein in the clamped position the grid carrier can be secured in the alignment feature of the end effector.

2. The specimen holder apparatus of claim 1, wherein the imaging system comprising an electron microscope.

3. The specimen holder apparatus of claim 1, wherein the end effector is configured for operation in a vacuum environment.

4. The specimen holder apparatus of claim 1, further comprising a sensor configured for determining the presence or absence of the specimen.

5. A specimen carrier apparatus for holding a specimen, the specimen carrier apparatus comprising:
   a bottom section having a pocket configured to support a grid with the specimen thereon; and
   at least one hold down finger configured to constrain the grid with the specimen thereon into the pocket, wherein the at least one hold down finger and the pocket are configured to align and constrain the grid in a predetermined orientation.

6. The specimen carrier apparatus of claim 5, further comprising a top section, wherein the top section and the bottom section are connected through a connection mechanism.

7. The specimen carrier apparatus of claim 6, wherein the connection mechanism comprising a hinge.

8. The specimen carrier apparatus of claim 5, wherein the grid carrier being configured to support a plurality of grid types.

9. The specimen carrier apparatus of claim 6, further comprising a locking device, wherein the locking device locks the top section to the bottom section when the grid carrier is closed and unlocks the top section from the bottom section when the grid carrier is open.

10. The specimen carrier apparatus of claim 5, wherein the at least one hold down finger extends from the bottom section.

11. The specimen carrier apparatus of claim 6, wherein the at least one hold down finger extends from the top section.

12. A specimen storage system for an automated specimen handling apparatus, the specimen storage system comprising:
   a grid carrier being configured to support a grid with a specimen thereon; and
   a grid carrier magazine being configured to support the grid carrier on at least one grid carrier magazine shelf, wherein the grid carrier magazine being configured to store grid carriers inside or outside of the automated specimen handling apparatus for a period of time.

13. The specimen storage system of claim 12, wherein the grid carrier being configured to support a plurality of grid types.

14. The specimen storage system of claim 12, wherein the grid carrier magazine being configured to align and constrain the grid carrier on a grid carrier magazine shelf.

15. The specimen storage system of claim 12, wherein the grid carrier magazine being configured to store a batch size of grid carriers that is greater than 1.

16. The specimen storage system of claim 12, wherein the grid carrier magazine being configured to enable the automated specimen handling apparatus to pick grid carriers from the grid carrier magazine and to place grid carriers to the grid carrier magazine.

17. The specimen storage system of claim 12, wherein the grid carrier magazine further comprises kinematic features, wherein the kinematic features being configured to enable handling of the specimen storage system inside or outside of the automated specimen handling apparatus.

18. The specimen storage system of claim 12, wherein the grid carriers and the grid carrier magazine being configured for operation in vacuum and non-vacuum environments.

19. The specimen storage system of claim 12, wherein the period of time comprising an extended period of time.

20. The specimen holder apparatus of claim 1, further comprising a driven member that is configured for urging the flexure towards the clamped and unclamped positions.

* * * * *